(12) United States Patent
Abou-Khalil et al.

(10) Patent No.: US 7,968,908 B2
(45) Date of Patent: Jun. 28, 2011

(54) BIDIRECTIONAL ELECTROSTATIC DISCHARGE PROTECTION STRUCTURE FOR HIGH VOLTAGE APPLICATIONS

(75) Inventors: Michel J. Abou-Khalil, Essex Junction, VT (US); Robert Gauthier, Essex Junction, VT (US); Junjun Li, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 12/563,610

(22) Filed: Sep. 21, 2009

(65) Prior Publication Data

US 2011/0068364 A1   Mar. 24, 2011

(51) Int. Cl.
*H01L 29/73* (2011.01)
(52) U.S. Cl. ................... 257/173; 257/E29.174
(58) Field of Classification Search .......... 257/173–178, 257/360, 365, E29.174
See application file for complete search history.

(56) References Cited

U.S. PATENT DOCUMENTS

| | | | |
|---|---|---|---|
| 3,535,615 A | 10/1970 | Howell et al. | |
| 5,780,905 A | 7/1998 | Chen et al. | |
| 5,932,898 A * | 8/1999 | Dikeman et al. | 257/173 |
| 6,011,681 A | 1/2000 | Ker et al. | |
| 6,538,266 B2 | 3/2003 | Lee et al. | |
| 6,762,439 B1 | 7/2004 | Chen et al. | |
| 6,960,792 B1 | 11/2005 | Nguyen | |
| 6,964,883 B2 | 11/2005 | Chang | |
| 6,998,651 B1 * | 2/2006 | Vashohenko et al. | 257/133 |
| 7,329,925 B2 * | 2/2008 | Tseng | 257/355 |
| 7,598,538 B2 * | 10/2009 | Kim | 257/173 |
| 2005/0045955 A1 * | 3/2005 | Kim et al. | 257/355 |
| 2005/0151160 A1 * | 7/2005 | Salcedo et al. | 257/173 |
| 2006/0017109 A1 * | 1/2006 | Yach et al. | 257/361 |
| 2006/0043487 A1 | 3/2006 | Pauletti et al. | |
| 2006/0145260 A1 | 7/2006 | Kim | |
| 2007/0291429 A1 | 12/2007 | Kawachi | |
| 2008/0029782 A1 | 2/2008 | Carpenter et al. | |
| 2009/0026493 A1 * | 1/2009 | Hiraoka | 257/173 |
| 2010/0006891 A1 * | 1/2010 | Minesaki | 257/173 |
| 2010/0065884 A1 * | 3/2010 | Ryu et al. | 257/112 |

* cited by examiner

*Primary Examiner* — Nathan W Ha
(74) *Attorney, Agent, or Firm* — Scully, Scott, Murphy & Presser, P.C.; Anthony J. Canale (57) ABSTRACT

Semiconductor structures providing protection against electrostatic events of both polarities are provided. A pair of p-n junctions is provided underneath a shallow trench isolation portion between a first-conductivity-type well and each of a signal-side second-conductivity-type well and an electrical-ground-side second-conductivity-type well in a semiconductor substrate. A second-conductivity-type doped region and a first-conductivity-type doped region are formed above each second-conductivity-type well such that a portion of the second-conductivity-type well resistively separates the second-conductivity-type doped region and the first-conductivity-type doped region within the semiconductor substrate. Each of the second-conductivity-type doped regions is wired either to a signal node or electrical ground. One of the two npn transistors and one of the two p-n diodes, each inherently present in the semiconductor structure, turn on to provide protection against electrical discharge events involving either type of excessive electrical charges.

20 Claims, 9 Drawing Sheets

BIDIRECTIONAL ELECTROSTATIC DISCHARGE PROTECTION STRUCTURE FOR HIGH VOLTAGE APPLICATIONS

BACKGROUND

The present invention relates to semiconductor structures and circuits, and particularly to semiconductor structures and circuits that require bidirectional protection against electrostatic discharges.

An electrostatic discharge (ESD) event can occur in a semiconductor chip when a charged conductor (including the human body) discharges a current through the semiconductor chip. An electrostatic charge may accumulate on a human body, for example, when one walks on a carpet. Contact of a body part, e.g., a finger, to a device containing a semiconductor chip causes the body to discharge, possibly causing damage to the semiconductor device. A similar discharge may occur from a charged conductive object, such as a metallic tool. Static charge may also accumulate on a semiconductor chip through handling or contact with packaging materials or work surfaces.

Such an ESD event can cause failure of components in a semiconductor chip through current overloading or reverse biasing. For example, radio frequency (RF) circuits including an antenna and a radio frequency switch that enables transmission or reception of an RF signal are vulnerable to electrostatic discharge of both polarities because the voltage on the antenna may be positive or negative at the time of the electrostatic discharge. Further, such an electrostatic discharge may occur while the antenna is electrically connected to an output node of a power amplifier to be employed as a transmission line or while the antenna is electrically connected to an input node of a low noise amplifier as a reception line. Typically, the switch connected to the antenna enables the selection of the operation of the antenna as a transmission line or a reception line. In either case, the voltage on the antenna may be either positive or negative depending on the phase of the RF signal on the antenna.

Thus, an antenna that is attached to a radio frequency circuit, which is typically a semiconductor structure including multiple semiconductor devices such as field effect transistors and/or bipolar transistors, require protection against electrostatic discharge events of both polarities, i.e., electrostatic discharge events caused by excessive electrons and electrostatic discharge events caused by excessive holes.

BRIEF SUMMARY

In an embodiment of the present invention, semiconductor structures providing protection against electrostatic events of both polarities are provided. A pair of p-n junctions, e.g., diodes, is provided underneath a shallow trench isolation portion between a first-conductivity-type well and each of a signal-side second-conductivity-type well and an electrical-ground-side second-conductivity-type well in a semiconductor substrate. A signal-side second-conductivity-type doped region and a signal-side first-conductivity-type doped region are formed above the signal-side second-conductivity-type well such that a portion of the signal-side second-conductivity-type well resistively separates the signal-side second-conductivity-type doped region and the signal-side first-conductivity-type doped region within the semiconductor substrate. Likewise, an electrical-ground-side second-conductivity-type doped region and an electrical-ground-side first-conductivity-type doped region are formed above the electrical-ground-side second-conductivity-type well such that a portion of the electrical-ground-side second-conductivity-type well resistively separates the electrical-ground-side second-conductivity-type doped region and the electrical-ground-side first-conductivity-type doped region within the semiconductor substrate. The signal-side second-conductivity-type doped region and the electrical-ground-side second-conductivity-type doped region are wired to a node having a signal of both polarities and electrical ground, respectively. One of two npn transistors and one of two p-n diodes, each inherently present in the semiconductor structure, are caused to turn on and form a silicon controlled rectifier to provide protection against electrical discharge events involving either type of excessive electrical charges.

According to an aspect of the present invention, a semiconductor structure is provided, which includes a substrate and an interconnect structure located thereupon. The substrate includes a first p-n junction between an first-conductivity-type well and a signal-side second-conductivity-type well; a second p-n junction between the first-conductivity-type well and an electrical-ground-side second-conductivity-type well, wherein the second-conductivity-type well does not contact the signal-side second-conductivity-type well; a signal-side second-conductivity-type doped region contacting the signal-side second-conductivity-type well; a signal-side first-conductivity-type doped region contacting the signal-side second-conductivity-type well and not contacting the signal-side second-conductivity-type doped region; an electrical-ground-side second-conductivity-type doped region contacting the electrical-ground-side second-conductivity-type well; and an electrical-ground-side first-conductivity-type doped region contacting the electrical-ground-side second-conductivity-type well and not contacting the electrical-ground-side second-conductivity-type doped region. The interconnect structure includes a dielectric material layer embedding a first conductive wiring structure and a second conductive wiring structure, the first conductive wiring structure providing a first conductive electrical connection between the signal-side first-conductivity-type doped region and a signal node of an electrical circuit, and the second conductive wiring structure providing a second conductive electrical connection between the electrical-ground-side first-conductivity-type doped region and electrical ground.

In one embodiment, the substrate further includes a buried insulator layer contacting a bottom surface of the first-conductivity-type well, a bottom surface of the signal-side second-conductivity-type well, and a bottom surface of the electrical-ground-side second-conductivity-type well; and a first shallow trench isolation structure contacting a top surface of the first-conductivity-type well.

In another embodiment, the substrate further includes: a first semiconductor portion contacting a bottom surface of the signal-side second-conductivity-type well; a second semiconductor portion contacting a bottom surface of the electrical-ground-side second-conductivity-type well; a buried insulator layer contacting a bottom surface of the first-conductivity-type well, a bottom surface of the first semiconductor portion, and a bottom surface of the second semiconductor portion; and a first shallow trench isolation structure contacting a top surface of the first-conductivity-type well.

In yet another embodiment, the substrate further includes a buried insulator layer contacting the first-conductivity-type well, the signal-side second-conductivity-type well, the electrical-ground-side second-conductivity-type well, the signal-side second-conductivity-type doped region, the signal-side first-conductivity-type doped region, the electrical-ground-side second-conductivity-type doped region, and the electrical-ground-side first-conductivity-type doped region.

In still another embodiment, the first-conductivity-type well extends to a greater depth into the substrate from a top surface of the substrate than the signal-side second-conductivity-type well and the electrical-ground-side second-conductivity-type well, and the signal-side second-conductivity-type well and the electrical-ground-side first-conductivity-type well are embedded in the first-conductivity-type well.

DETAILED DESCRIPTION

As stated above, the present invention relates to semiconductor structures and circuits, and particularly to semiconductor structures and circuits that require bidirectional protection against electrostatic discharges, which are now described in detail with accompanying figures. It is noted that like and corresponding elements are referred to by like reference numerals.

As used herein, a first element "contacts" a second element when a surface of the first element physically contacts a surface of the second element without any intervening elements therebetween.

As used herein, a "conductive electrical connection" includes an electrical connection consisting of conductive structures and not including a capacitive structure or an inductive structure in a path of the electrical connection.

Figure 1:
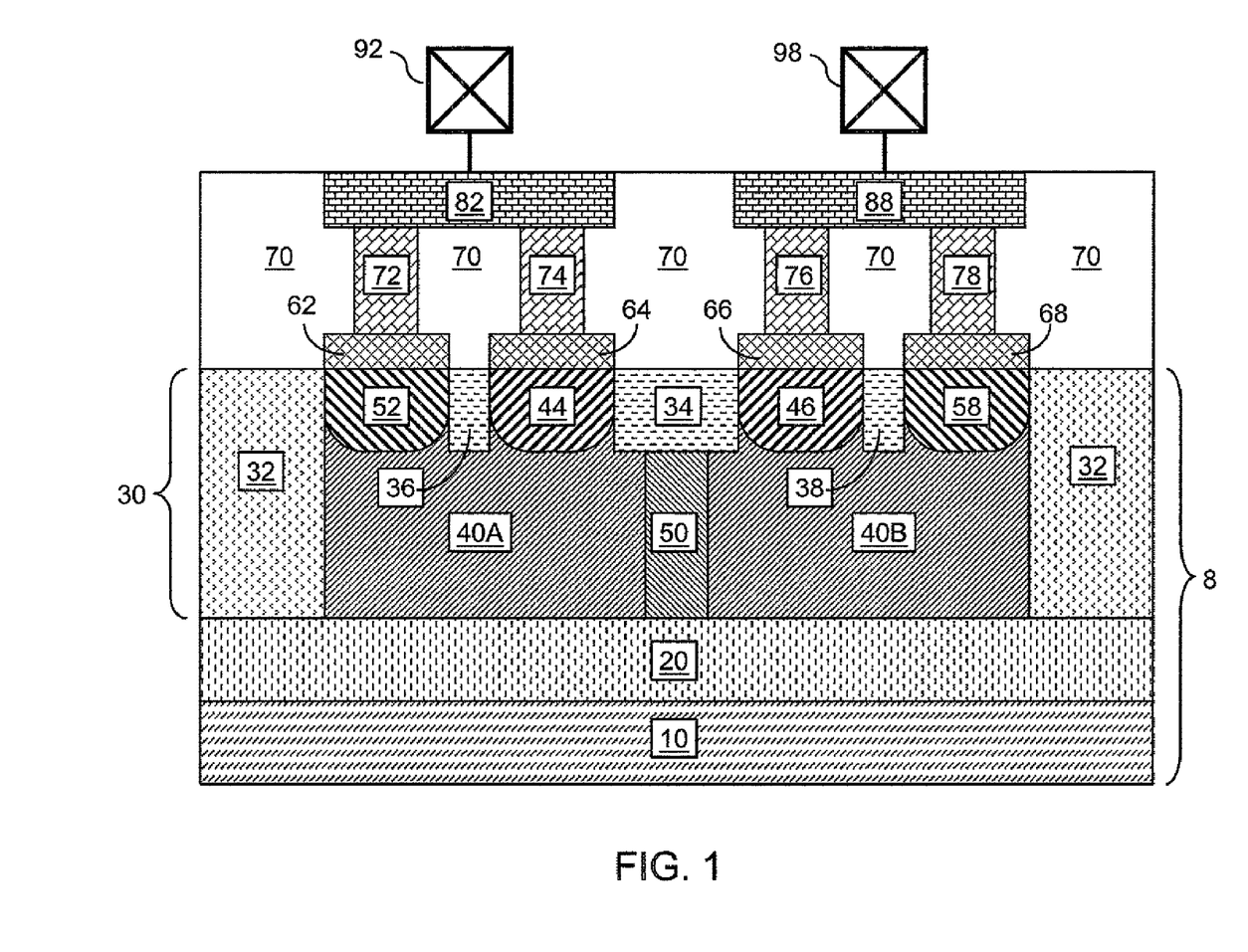
FIG. 1 is a vertical cross-sectional view of a first exemplary semiconductor structure according to a first embodiment of the present invention.

Referring to FIG. 1, a first exemplary semiconductor structure according to a first embodiment of the present invention includes a substrate 8 and an interconnect structure located thereupon. The substrate 8 includes a semiconductor layer 10, a buried insulator layer 20, and a patterned structure layer 30 located on the buried insulator layer 20. The patterned structure layer 30 includes a first-conductivity-type well 50, a signal-side second-conductivity-type well 40A, and an electrical-ground-side second-conductivity-type well 40B.

The first-conductivity-type well 50 is a well including a semiconductor material having a doping of a first conductivity type, which may be p-type or n-type. Each of the signal-side second-conductivity-type well 40A and the electrical-ground-side second-conductivity-type well 40B is a well including a semiconductor material having a doping of a second conductivity type, which is the conductivity type that is the opposite of the first conductivity type. If the first conductivity type is p-type, the second conductivity type is n-type, and vice versa. Thus, if the first-conductivity-type well 50 is an n-type well, i.e., an well having an n-type doping, the signal-side second-conductivity-type well 40A and the electrical-ground-side second-conductivity-type well 40B are p-type wells, i.e., wells having a p-type doping. If the first-conductivity-type well 50 is a p-type well, the signal-side second-conductivity-type well 40A and the electrical-ground-side second-conductivity-type well 40B are n-type wells.

Each of the first-conductivity-type well 50, the signal-side second-conductivity-type well 40A, and the electrical-ground-side second-conductivity-type well 40B has a doping at a dopant concentration from $1.0 \times 10^{14}/cm^3$ to $1.0 \times 10^{19}/cm^3$. A first p-n junction is provided between the first-conductivity-type well 50 and the signal-side second-conductivity-type well 40A, and a second p-n junction is provided between the first-conductivity-type well 50 and an electrical-ground-side second-conductivity-type well 40B. The signal-side second-conductivity-type well 40A does not contact the electrical-ground-side second-conductivity-type well 40B.

The patterned structure layer 30 located on the buried insulator layer 20 includes a signal-side second-conductivity-type doped region 44 and a signal-side first-conductivity-type doped region 52. A bottom surface of the signal-side second-conductivity-type doped region 44 contacts the signal-side second-conductivity-type well 40A, and a bottom surface of the signal-side first-conductivity-type doped region 52 contacts the signal-side second-conductivity-type well 40A. The signal-side second-conductivity-type doped region 44 does not contact the signal-side first-conductivity-type doped region 52 or the first-conductivity-type well 50.

The patterned structure layer 30 includes an electrical-ground-side second-conductivity-type doped region 46 and an electrical-ground-side first-conductivity-type doped region 58. A bottom surface of the electrical-ground-side second-conductivity-type doped region 46 contacts the electrical-ground-side second-conductivity-type well 40B, and a bottom surface of the electrical-ground-side first-conductivity-type doped region 58 contacts the electrical-ground-side second-conductivity-type well 40B. The electrical-ground-side second-conductivity-type doped region 46 does not contact the electrical-ground-side first-conductivity-type doped region 58 or the first-conductivity-type well 50.

Each of the signal-side second-conductivity-type doped region 44, the signal-side first-conductivity-type doped region 52, the electrical-ground-side second-conductivity-type doped region 46, and the electrical-ground-side first-conductivity-type doped region 58 has a doping at a dopant concentration that is greater than the dopant concentration of the signal-side second-conductivity-type well 40A and the electrical-ground-side second-conductivity-type well 40B. Typically, the dopant concentration of each of the signal-side second-conductivity-type doped region 44, the signal-side first-conductivity-type doped region 52, the electrical-ground-side second-conductivity-type doped region 46, and the electrical-ground-side first-conductivity-type doped region 58 is from $1.0 \times 10^{19}/cm^3$ to $1.0 \times 10^{21}/cm^3$.

The first-conductivity-type well 50, the signal-side second-conductivity-type well 40A, the electrical-ground-side second-conductivity-type well 40B, the signal-side first-conductivity-type doped region 52, the signal-side second-conductivity-type doped region 44, the electrical-ground-side second-conductivity-type doped region 46, and the electrical-ground-side first-conductivity-type doped region 58 may be a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material may be single crystalline across the entirety of the first-conductivity-type well 50, the signal-side second-conductivity-type well 40A, the electrical-ground-side second-conductivity-type well 40B, the signal-side first-conductivity-type doped region 52, the signal-side second-conductivity-type doped region 44, the electrical-ground-side second-conductivity-type doped region 46, and the electrical-ground-side first-conductivity-type doped region 58.

The patterned structure layer 30 includes a first shallow trench isolation structure 34, a second shallow trench isolation structure 36, and a third shallow trench isolation structure 38. The first, second, and third shallow trench isolation structures (34, 36, 38) includes a dielectric material such as silicon oxide, silicon nitride, or silicon oxynitride. The first, second, and third shallow trench isolation structures (34, 36, 38) may be contiguous among one another, i.e., may be a single contiguous structure.

The first shallow trench isolation structure 34 contacts a sidewall of the signal-side second-conductivity-type doped region 44 and a sidewall of the electrical-ground-side second-conductivity-type doped region 46. The second shallow trench isolation structure 36 contacts a top surface of the signal-side second-conductivity-type well 40A, a sidewall of the signal-side second-conductivity-type doped region 44, and a sidewall of the signal-side first-conductivity-type doped region 52. The third shallow trench isolation structure 38 contacts a top surface of the electrical-ground-side second-conductivity-type well 40B, a sidewall of the electrical-ground-side second-conductivity-type doped region 46, and the electrical-ground-side first-conductivity-type doped region 58. The depth of the first, second, and third shallow trench isolation structures (34, 36, 38), i.e. the vertical distance between the top surfaces of the first, second, and third shallow trench isolation structures (34, 36, 38) and the bottom surfaces of the first, second, and third shallow trench isolation structures (34, 36, 38), may be from 100 nm to 500 nm, although lesser and greater depths may also be employed.

A top surface of the buried insulator layer 20 contacts a bottom surface of the first-conductivity-type well 50, a bottom surface of the signal-side second-conductivity-type well 40A, and a bottom surface of the electrical-ground-side second-conductivity-type well 40B. The patterned structure layer 30 includes at least one deep trench 32 that extends from a top surface of the patterned structure layer 30 to the top surface of the buried insulator layer 20. The outer surfaces of the at least one deep trench 32 has a dielectric material such as silicon oxide, silicon nitride, or silicon oxynitride. The entirety of the at least one deep trench 32 may be a dielectric material. Alternatively, an inner portion of the at least one deep trench 32 may be a semiconductor material such as polysilicon or a silicon-germanium alloy. The at least one deep trench 32 may contact the signal-side first-conductivity-type doped region 52 and the electrical-ground-side first-conductivity-type doped region 58. The at least one deep trench 32 laterally encloses the first-conductivity-type well 50, the signal-side second-conductivity-type well 40A, the electrical-ground-side second-conductivity-type well 40B, the signal-side first-conductivity-type doped region 52, the signal-side second-conductivity-type doped region 44, the electrical-ground-side second-conductivity-type doped region 46, the electrical-ground-side first-conductivity-type doped region 58, and the first, second, and third shallow trench isolation structures (34, 36, 38).

The first exemplary semiconductor structure includes an interconnect structure located on the patterned structure layer 30. The interconnect structure includes a dielectric material layer 70 embedding a first conductive wiring structure and a second conductive wiring structure. The first conductive wiring structure provides a first conductive electrical connection between the signal-side first-conductivity-type doped region 52 and a signal node 92 of an electrical circuit to be protected from electrostatic discharge of positive charges and negative charges by the first exemplary semiconductor structure. The second conductive wiring structure provides a second conductive electrical connection between the electrical-ground-side first-conductivity-type doped region 58 and electrical ground 98 of the electrical circuit.

The first conductive wiring structure includes a first metal semiconductor alloy region 62 located on the signal-side first-conductivity-type doped region 52, a first conductive via 72 located on the first metal semiconductor alloy region 62, and a first metal line 82 located on the first conductive via 72. The first metal semiconductor alloy region 62, the first conductive via 72, and the first metal line 82 provide a first conductive electrical connection. The first conductive wiring structure further includes a second metal semiconductor alloy region 64 located on the signal-side second-conductivity-type doped region 44, and a second conductive via 74 located on the second metal semiconductor alloy region 64 and connected to the first metal line 82. The second metal semiconductor alloy region 64, the second conductive via 72, and the first metal line 82 provide a third conductive electrical connection between the signal-side second-conductivity-type doped region 44 and the signal node 92 of the electrical circuit. The first conductive wiring structure (62, 64, 72, 74, 82) provides the first conductive electrical connection and the third conductive electrical connection.

The schematic electrical connection between the signal node 92 and the first metal line 82 may be implemented by at least one conductive via, at least one conductive line, at least one bonding pad, at least one bonding wire, or a combination thereof. The signal node 92 may be an antenna, or any other signal node of a semiconductor device.

The second conductive wiring structure includes a third metal semiconductor alloy region 66 located on the electrical-ground-side second-conductivity-type doped region 46, a third conductive via 76 located on the third metal semiconductor alloy region 66, and a second metal line 88 located on the third conductive via 76. The third metal semiconductor alloy region 66, the third conductive via 76, and the second metal line 88 provide a fourth conductive electrical connection between the electrical-ground-side second-conductivity-type doped region 46 and the electrical ground 98 of the electrical circuit. In addition, the second conductive wiring structure includes a fourth metal semiconductor alloy region 68 located on the electrical-ground-side first-conductivity-type doped region 58 and a fourth conductive via 78 located on the fourth metal semiconductor alloy region 68 and connected to the second metal line 88. The fourth metal semiconductor alloy region 68, the fourth conductive via 78, and the second metal line 88 provide the second conductive electrical connection. The second conductive wiring structure (66, 68, 76, 78, 88) provides the second conductive electrical connection and the fourth conductive electrical connection.

Figure 2:
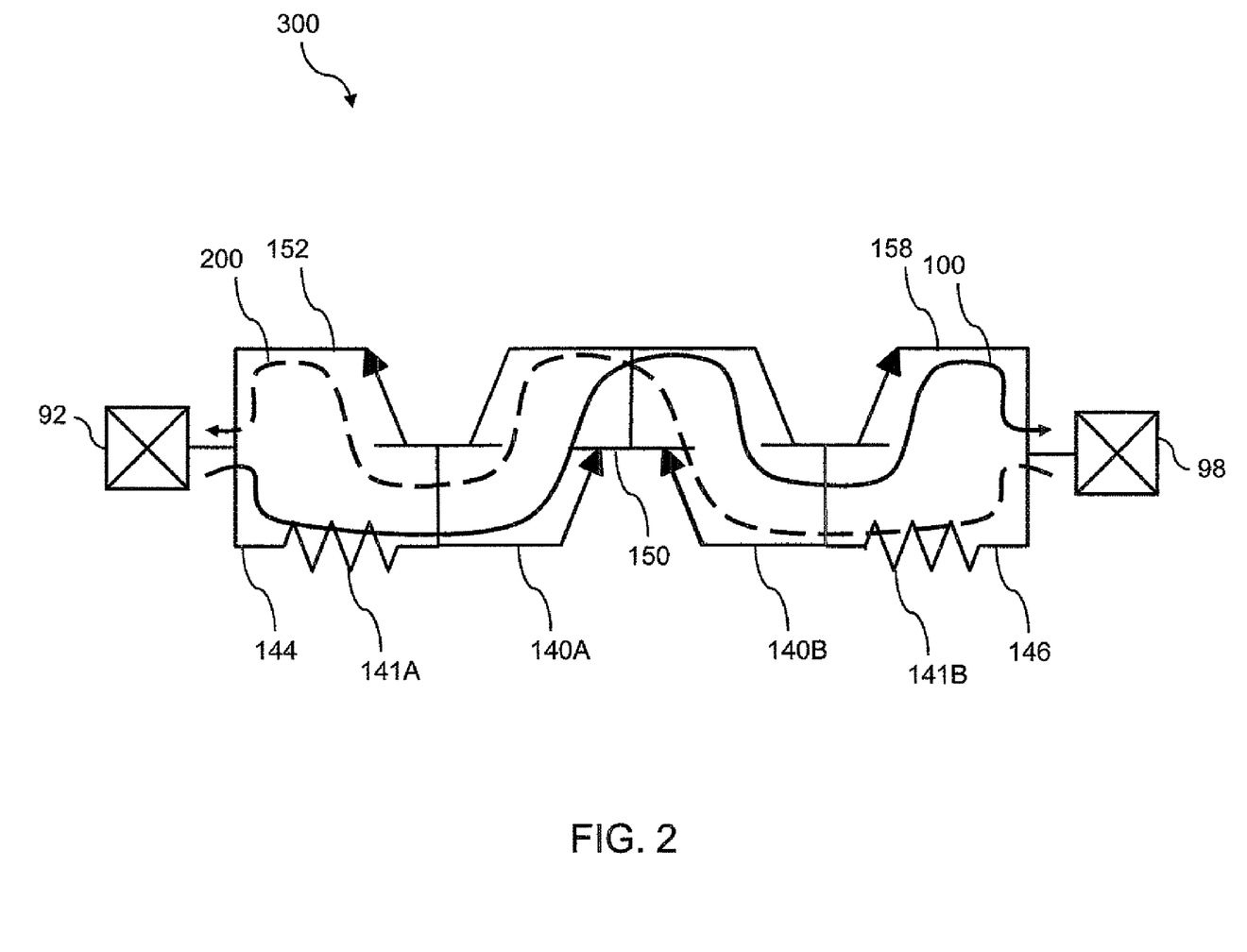
FIG. 2 is a circuit schematic of the first exemplary semiconductor structure according to the first embodiment of the present invention.

Referring to FIG. 2, a circuit schematic 300 of the first exemplary semiconductor structure is shown according to the first embodiment of the present invention. The circuit schematic 300 corresponds to a case in which the first conductivity type is n-type and the second conductivity type is p-type. Embodiments in which the polarity of the first and second conductivity types is reversed may also be employed.

The circuit schematic 300 includes a series connection containing, from one side to the other, a signal node 92, a signal-side second-conductivity-type doped region node 144, a signal-side second-conductivity-type well resistor 141A, a signal-side second-conductivity-type well node 140A, a first-conductivity-type well node 150, an electrical-ground-side second-conductivity-type well node 140B, an electrical-ground-side second-conductivity-type well resistor 141B, an electrical-ground-side second-conductivity-type doped region node 146, and electrical ground 98. Further, the circuit schematic 300 includes another series connection including, form the one side to the other, the signal node 92, a signal-side first-conductivity-type doped region node 152, a first npn transistor, the first-conductivity-type well node 150, a second npn transistor, an electrical-ground-side first-conductivity-type doped region node 158, and electrical ground 98.

The first-conductivity-type well node 150 may be implemented as the first-conductivity-type well 50 in the first exemplary semiconductor structure. The signal-side second-conductivity-type doped region node 144 may be implemented by the signal-side second-conductivity-type doped region 44 in the first exemplary semiconductor structure. The electrical-ground-side second-conductivity-type doped region node 146 may be implemented by the electrical-ground-side second-conductivity-type doped region 46 in the first exemplary semiconductor structure shown in FIG. 1.

The signal-side second-conductivity-type well resistor 141A and the signal-side second-conductivity-type well node 140A may be implemented by the signal-side second-conductivity-type well 40A in the first exemplary semiconductor structure. The inherent internal resistance of the signal-side second-conductivity-type well 41A provides the resistance of the signal-side second-conductivity-type well resistor 141A. The signal-side second-conductivity-type well node 140A corresponds to a portion of the signal-side second-conductivity-type well 40A in proximity to, and in contact with, a first pn junction formed with the first-conductivity-type well 50. The electrical-ground-side second-conductivity-type well resistor 141B and the electrical-ground-side second-conductivity-type well node 140B may be implemented by the electrical-ground-side second-conductivity-type well 40B in the first exemplary semiconductor structure. The inherent internal resistance of the electrical-ground-side second-conductivity-type well 41B provides the resistance of the electrical-ground-side second-conductivity-type well resistor 141B. The electrical-ground-side second-conductivity-type well node 140B corresponds to a portion of the electrical-ground-side second-conductivity-type well 40B in proximity to, and in contact with, a second pn junction with the first-conductivity-type well 50.

The first npn transistor located between the signal-side first-conductivity-type doped region node 152 and the first-conductivity-type well node 150 is physically embodied as the signal-side first-conductivity-type doped region 52, the signal-side second-conductivity-type well 40A, and the first-conductivity-type well 50. The second npn transistor located between the electrical-ground-side first-conductivity-type doped region node 158 and the first-conductivity-type well node 150 is physically embodied as the electrical-ground-side first-conductivity-type doped region 58, the electrical-ground-side second-conductivity-type well 40B, and the first-conductivity-type well 50. The two diodes at the first-conductivity-type well node 150 is physically embodied as the first pn junction between the signal-side second-conductivity-type well 40A and the first-conductivity-type well 50 and the second pn junction between the electrical-ground-side second-conductivity-type well 40B and the first-conductivity-type well 50. (These two pn junctions also form a pnp transistor.)

The electrical circuit of the circuit schematic 300 provides protection against electrostatic discharge of both polarities by employing two alternative conductive paths. If the signal node 92 is applied with, or is subject to, an excessive amount of charge carriers forming a large positive voltage, electrostatic discharge current flows through a first electrostatic discharge current path 100, i.e., from the signal node 92, through the signal-side second-conductivity-type well 41A, the first-conductivity-type well 50, the electrical-ground-side second-conductivity-type well 40B, and the electrical-ground-side first-conductivity-type doped region 58, and to electrical ground 98 in the first exemplary semiconductor structure. A fraction of the electrostatic discharge current flows through the electrical-ground-side second-conductivity-type doped region 46. If the signal node 92 is applied with, or is subject to, an excessive amount of charge carriers forming a large negative voltage, electrostatic discharge current flows through a second electrostatic discharge current path 200, i.e., from electrical ground 98, through the electrical-ground-side second-conductivity-type well 41B, the first-conductivity-type well 50, the signal-side second-conductivity-type well 40A, and the signal-side first-conductivity-type doped region 52, and to the signal node 92. A fraction of the electrostatic discharge current flows through the signal-side second-conductivity-type doped region 44.

Figure 3:
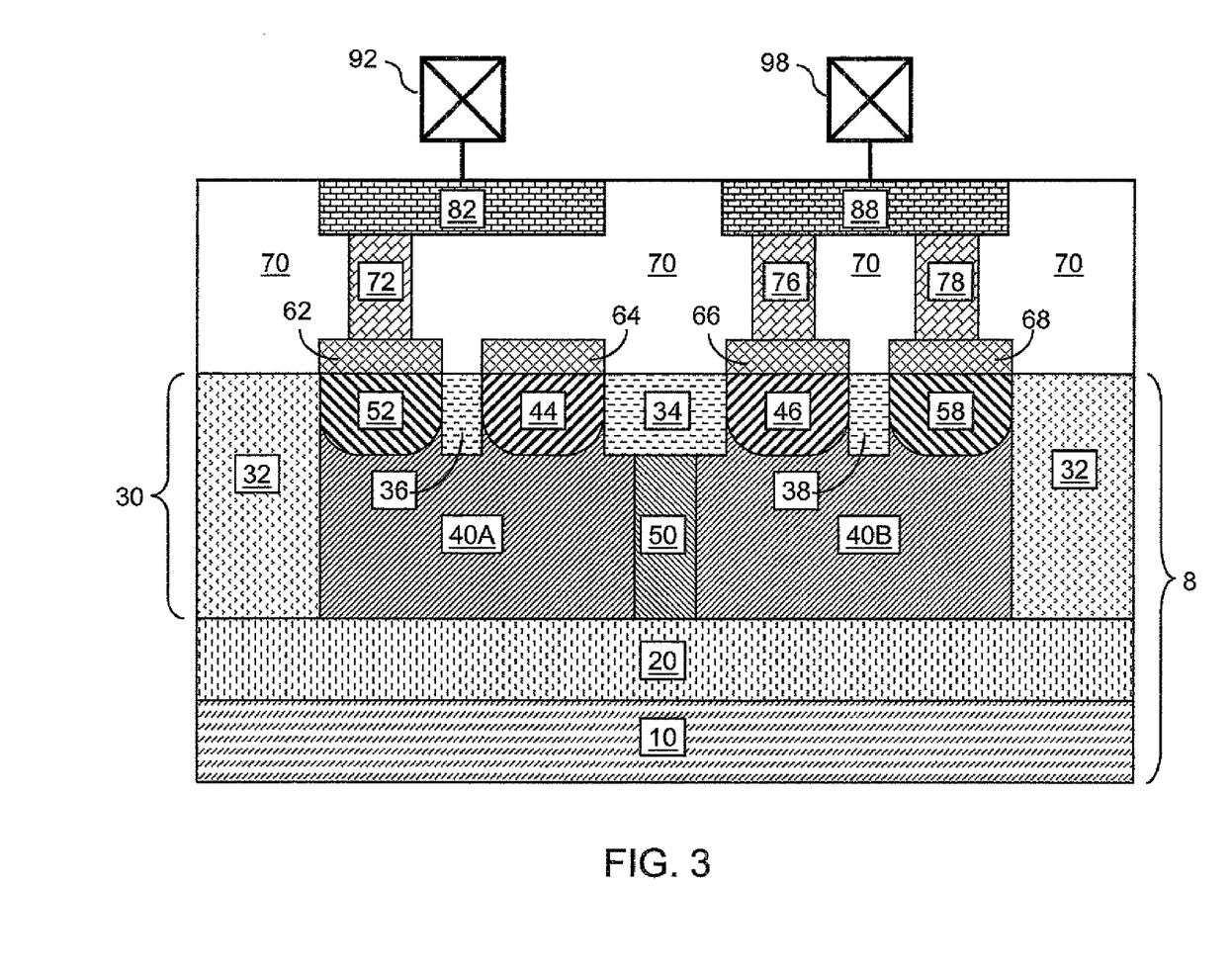
FIG. 3 is a vertical cross-sectional view of a first variation of the first exemplary semiconductor structure according to the first embodiment of the present invention.

Variations on the first exemplary semiconductor structure may be employed to provide protection against electrostatic discharges of positive and negative charge carriers. Referring to FIG. 3, a first variation of the first exemplary semiconductor structure is derived from the first exemplary semiconductor structure of FIG. 1 by removing the second conductive via 74 (See FIG. 1). Thus, the third conductive electrical connection in the first exemplary semiconductor structure is not present in the first variation of the first exemplary semiconductor structure. All electrical current during an electrostatic discharge event flows through the signal-side first-conductivity-type doped region 52.

Figure 4:
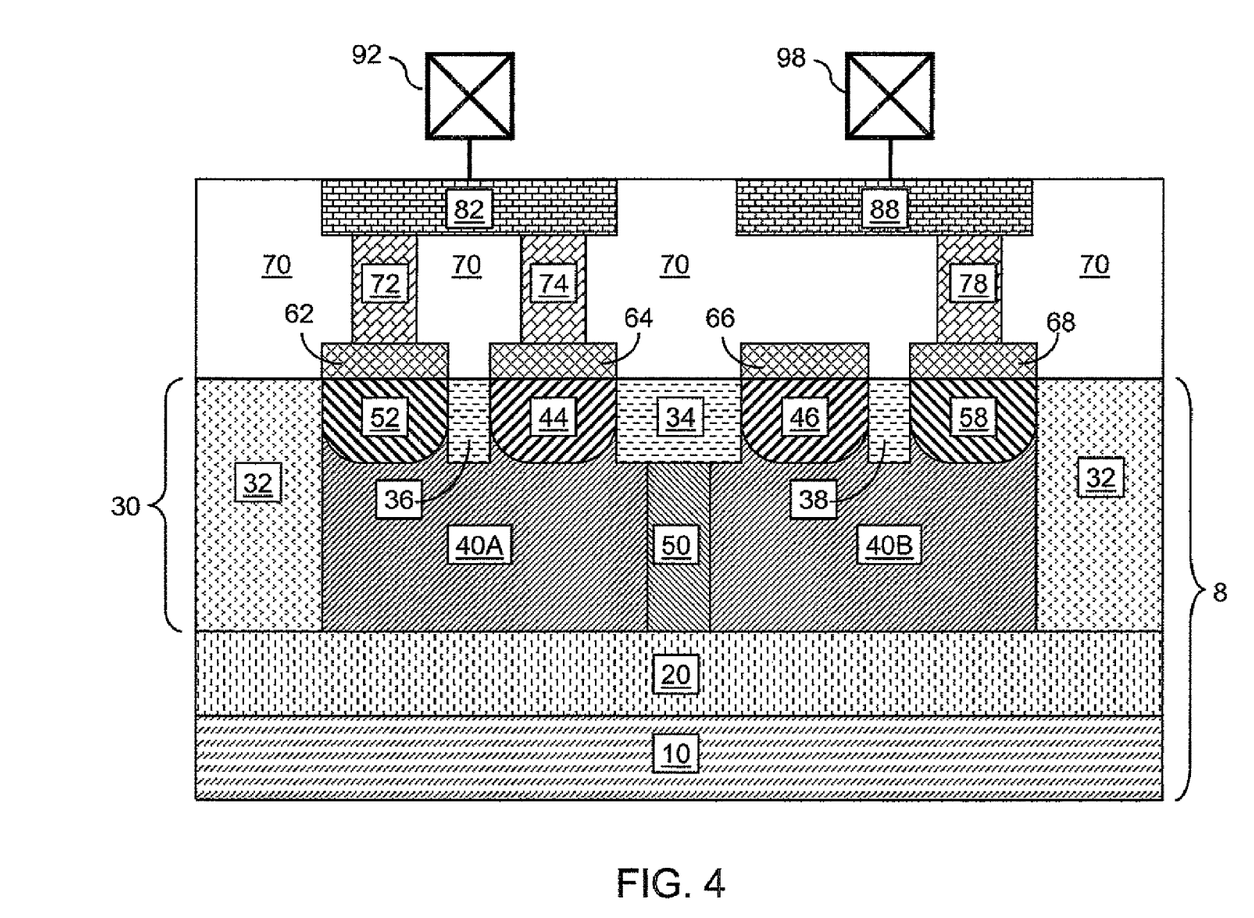
FIG. 4 is a vertical cross-sectional view of a second variation of the first exemplary semiconductor structure according to the first embodiment of the present invention.

Referring to FIG. 4, a second variation of the first exemplary semiconductor structure is derived from the first exemplary semiconductor structure of FIG. 1 by removing the third conductive via 76 (See FIG. 1). Thus, the fourth conductive electrical connection in the first exemplary semiconductor structure is not present in the second variation of the first exemplary semiconductor structure. All electrical current during an electrostatic discharge event flows through the electrical-ground-side first-conductivity-type doped region 58.

Figure 5:
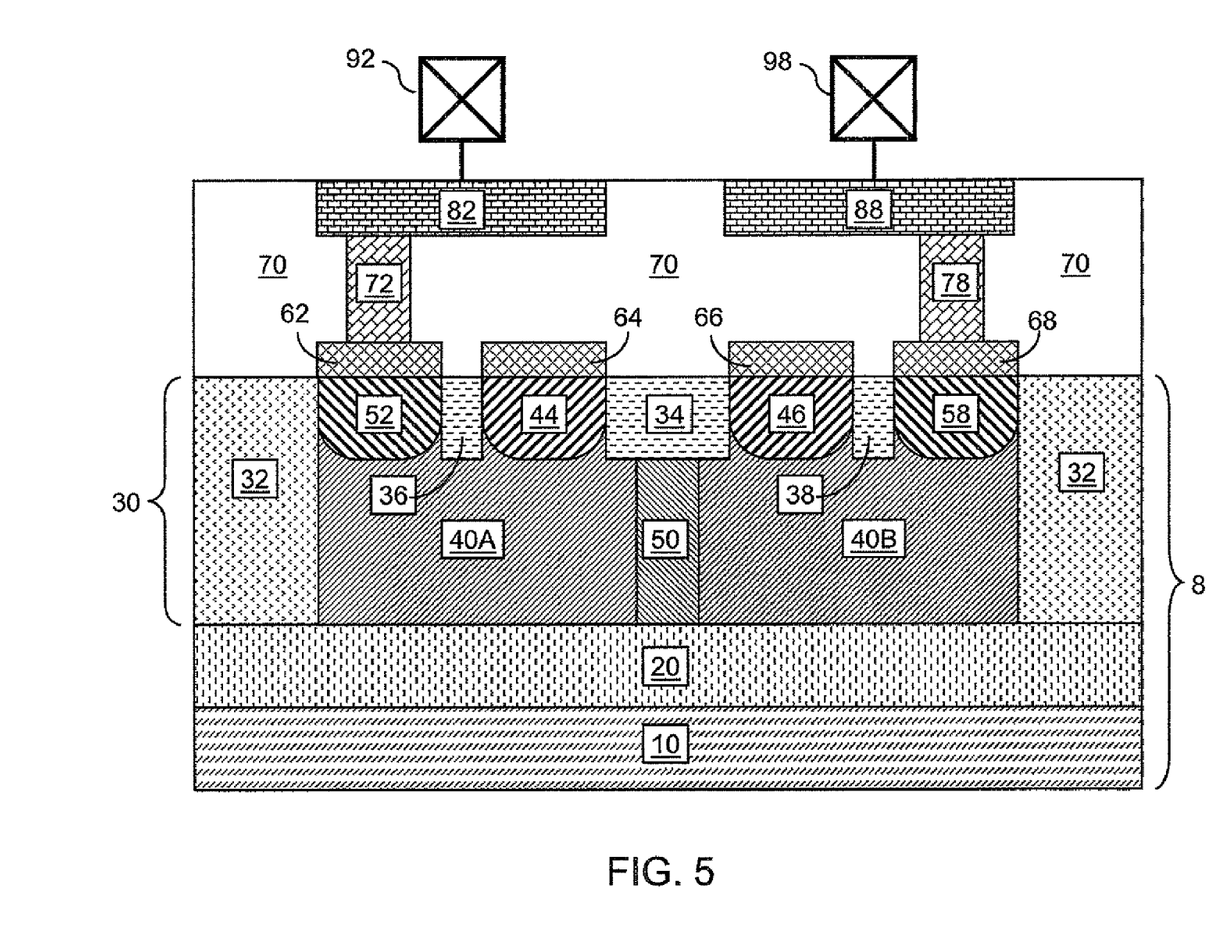
FIG. 5 is a vertical cross-sectional view of a third variation of the first exemplary semiconductor structure according to the first embodiment of the present invention.

Referring to FIG. 5, a third variation of the first exemplary semiconductor structure is derived from the first exemplary semiconductor structure of FIG. 1 by removing the second conductive via 74 and the third conductive via 76. Thus, the third conductive electrical connection and the fourth conductive electrical connection in the first exemplary semiconductor structure are not present in the third variation of the first exemplary semiconductor structure. All electrical current during an electrostatic discharge event flows through the signal-side first-conductivity-type doped region 52 and the electrical-ground-side first-conductivity-type doped region 58.

Figure 6:
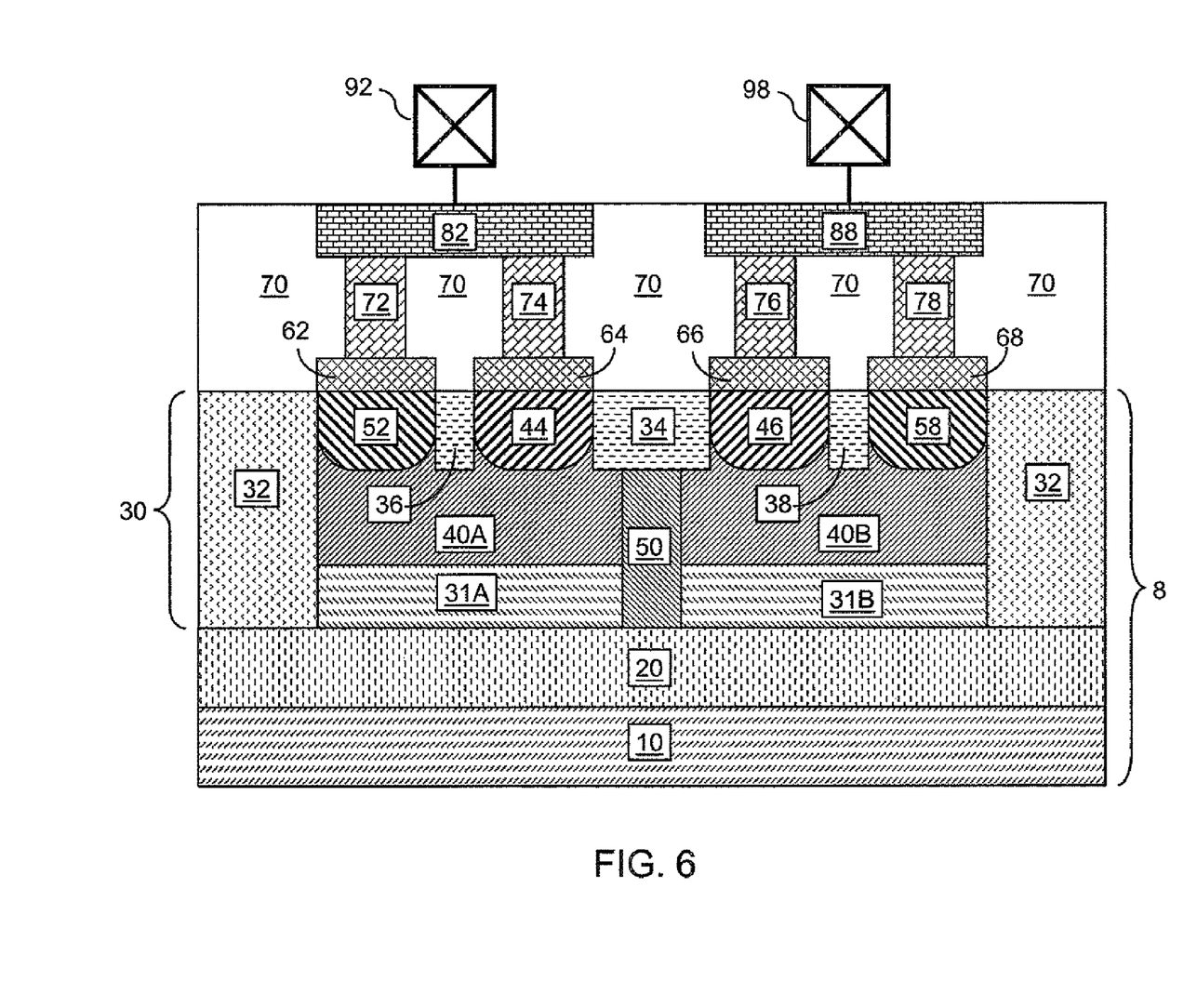
FIG. 6 is a vertical cross-sectional view of a second exemplary semiconductor structure according to a second embodiment of the present invention.

Referring to FIG. 6, a second exemplary semiconductor structure according to a second embodiment of the present invention includes a patterned structure layer 30. The patterned structure layer 30 includes a first semiconductor portion 31A and a second semiconductor portion 31B. The signal-side second-conductivity-type well 40A is formed such that the first semiconductor portion 31A contacts a bottom surface of the signal-side second-conductivity-type well 40A, and the second semiconductor portion 31B contacts a bottom surface of the electrical-ground-side second-conductivity-type well 40B. The buried insulator layer 20 contacts a bottom surface of the first-conductivity-type well 50, a bottom surface of the first semiconductor portion 31A, and a bottom surface of the second semiconductor portion 31B. The first shallow trench isolation structure 34 contacts a top surface of the first-conductivity-type well 50 and two p-n junctions.

The first semiconductor portion 31A and the second semiconductor portion 31B may be an intrinsic semiconductor material, a p-doped semiconductor material, or an n-doped semiconductor material. If the first semiconductor portion 31A and the second semiconductor portion 31B are doped with p-type dopants or n-type dopants, the dopant concentration of the first semiconductor portion 31A and the second semiconductor portion 31B is preferably lower than the dopant concentration of the signal-side second-conductivity-type well 40A and the electrical-ground-side second-conductivity-type well 40B.

The at least one deep trench isolation structure 32 contacts the buried insulator layer 20 and laterally surrounding the first-conductivity-type well 50, the signal-side second-conductivity-type well 40A, the electrical-ground-side second-conductivity-type well 40B, the first semiconductor portion 31A, and the second semiconductor portion 31B.

Variations of the second exemplary semiconductor structure in which the second conductive via 74 and/or the third conductive via 76 is removed as in the variations of the first exemplary semiconductor structure may also be employed.

Figure 7:
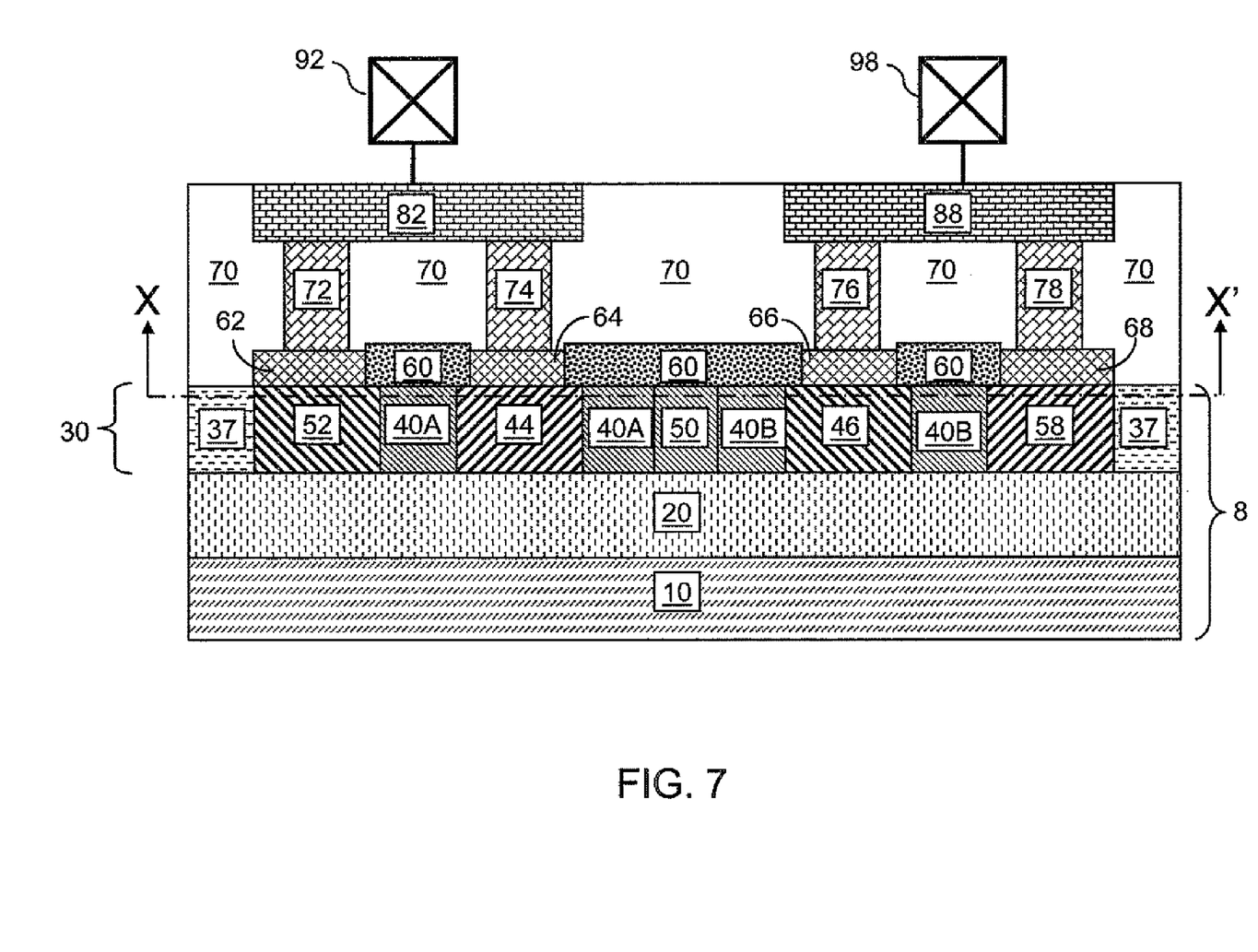
FIG. 7 is a vertical cross-sectional view of a third exemplary semiconductor structure according to a third embodiment of the present invention.
Figure 8:
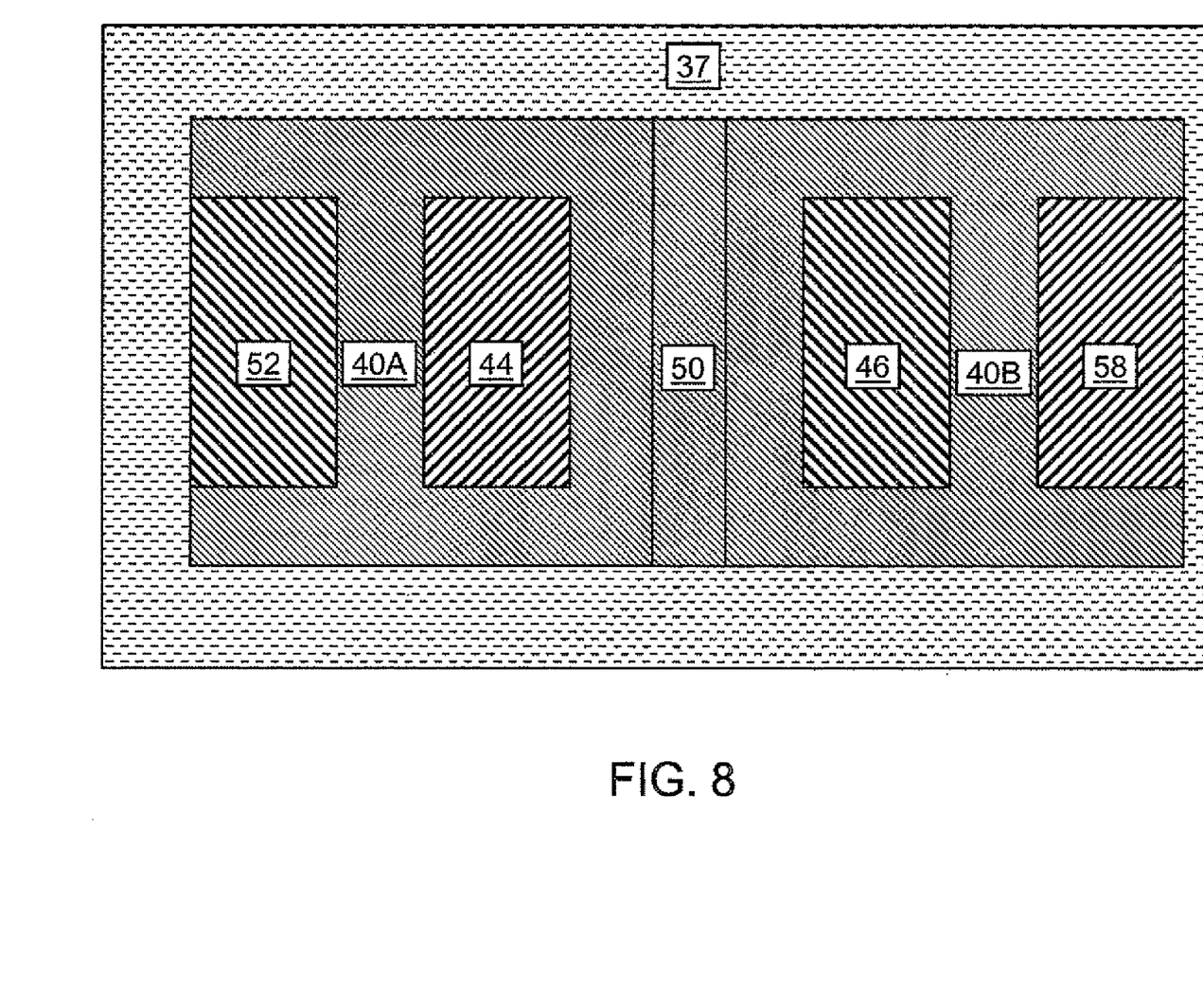
FIG. 8 is a horizontal cross-sectional view of the third exemplary semiconductor structure according to the third embodiment of the present invention.

Referring to FIGS. 7 and 8, a third exemplary semiconductor structure according to a third embodiment of the present invention includes a substrate 8 including a stack of a patterned structure layer 30, a buried insulator layer 20, and a semiconductor layer 10. The top surfaces of the first-conductivity-type well 50, the signal-side second-conductivity-type well 40A, the electrical-ground-side second-conductivity-type well 40B, the signal-side first-conductivity-type doped region 52, the signal-side second-conductivity-type doped region 44, the electrical-ground-side second-conductivity-type doped region 46, and the electrical-ground-side first-conductivity-type doped region 58 are coplanar among one another. Further, the bottom surfaces of the first-conductivity-type well 50, the signal-side second-conductivity-type well 40A, the electrical-ground-side second-conductivity-type well 40B, the signal-side first-conductivity-type doped region 52, the signal-side second-conductivity-type doped region 44, the electrical-ground-side second-conductivity-type doped region 46, and the electrical-ground-side first-conductivity-type doped region 58 are coplanar among one another and contacts a top surface of the buried insulator layer 20.

The signal-side second-conductivity-type doped region 44 is laterally surrounded by the signal-side second-conductivity-type well 40A, and the electrical-ground-side second-conductivity-type doped region 46 is laterally surrounded by the electrical-ground-side second-conductivity-type well 40B. The signal-side second-conductivity-type well 40A contacts all sidewall surfaces of the signal-side second-conductivity-type doped region 44, and the electrical-ground-side second-conductivity-type well 40B contacts all sidewall surfaces of the electrical-ground-side second-conductivity-type doped region 46.

The third exemplary semiconductor structure does not include any deep trench such as the at least one trench 32 in the first and second exemplary semiconductor structures, but includes a shallow trench isolation structure 37 that contacts and laterally surrounds the first-conductivity-type well 50, the signal-side second-conductivity-type well 40A, and the electrical-ground-side second-conductivity-type well 40B. Electrical short between adjoined exposed portions of semiconductor materials is avoided by forming a dielectric material portion 60 above the surfaces of the first-conductivity-type well 50, the signal-side second-conductivity-type well 40A, and the electrical-ground-side second-conductivity-type well 40B. The dielectric material portion 60 includes a dielectric material such as silicon oxide, silicon nitride, silicon oxynitride, or a combination thereof. The dielectric material portion 60 contacts top surfaces of the first-conductivity-type well 50, the signal-side second-conductivity-type well 40A, and the electrical-ground-side second-conductivity-type well 40B. Preferably, the dielectric material portion 60 covers the entirety of the top surfaces of the first-conductivity-type well 50, the signal-side second-conductivity-type well 40A, and the electrical-ground-side second-conductivity-type well 40B so that the first, second, third, and fourth metal semiconductor alloy regions (62, 64, 66, 68) are formed only on the signal-side first-conductivity-type doped region 52, the signal-side second-conductivity-type doped region 44, the electrical-ground-side second-conductivity-type doped region 46, and the electrical-ground-side first-conductivity-type doped region 58, respectively.

Variations of the third exemplary semiconductor structure in which the second conductive via 74 and/or the third conductive via 76 is removed as in the variations of the first exemplary semiconductor structure may also be employed.

Figure 9:
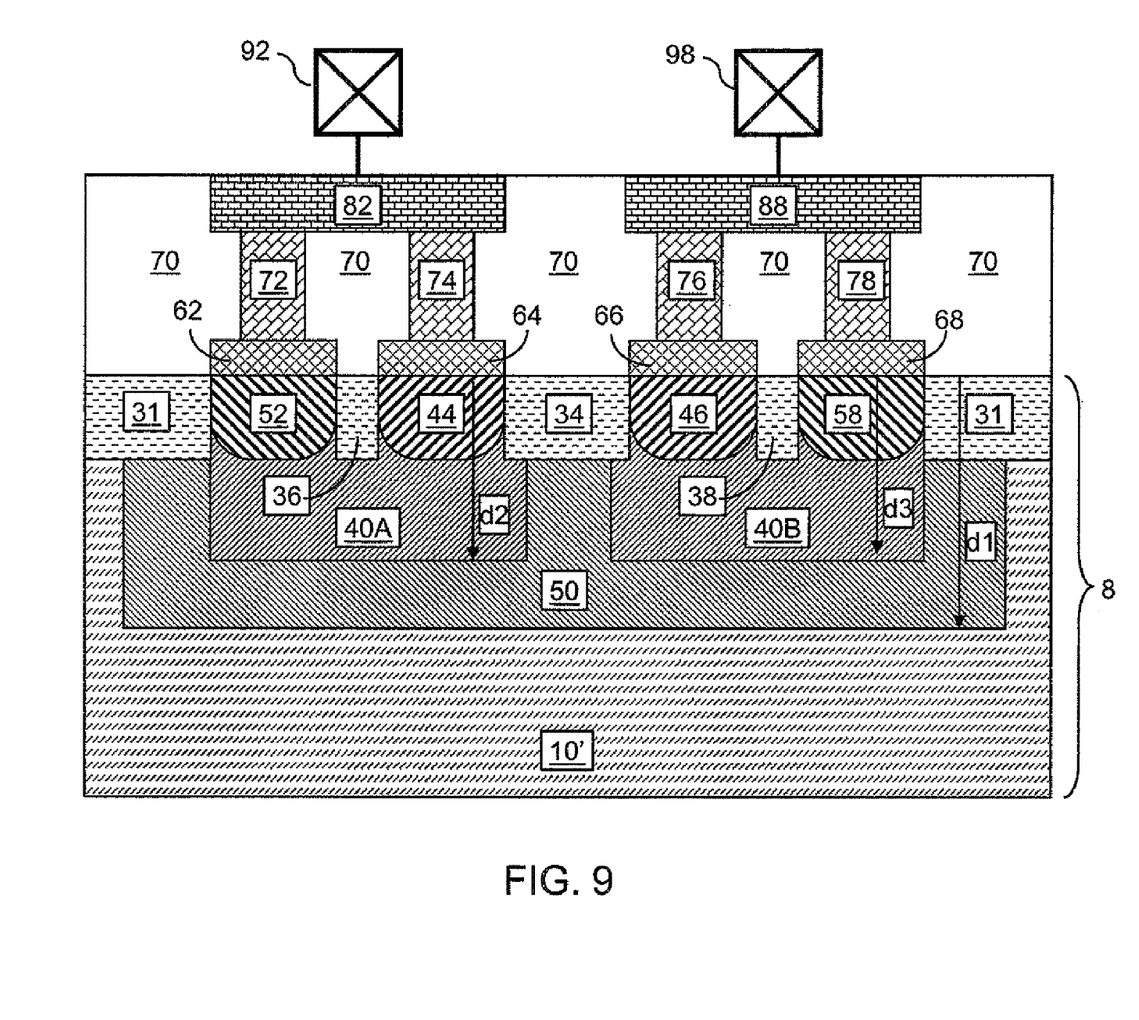
FIG. 9 is a vertical cross-sectional view of a fourth exemplary semiconductor structure according to a fourth embodiment of the present invention.

Referring to FIG. 9, a fourth exemplary semiconductor structure according to a fourth embodiment of the present invention is shown. A substrate 8 of the fourth exemplary semiconductor structure includes a second-conductivity-type semiconductor layer 10', a first-conductivity-type well 50 that extends to a first depth d1 from the top surface of the substrate 8, a signal-side second-conductivity-type well 40A that is embedded in the first-conductivity-type well 50 and extends to a second depth d2 from the top surface of the substrate 8, and an electrical-ground-side second-conductivity-type well 40B that is embedded in the first-conductivity-type well 50 and extends to a third depth d3 from the top surface of the substrate 8. The second-conductivity-type semiconductor layer 10' embeds the first-conductivity-type well 50.

The first depth d1 is greater than the second depth d2 and the third depth d3. Thus, the first-conductivity-type well 50 extends to a greater depth into the substrate 8 from a top surface of the substrate 8 than the signal-side second-conductivity-type well 40A and the electrical-ground-side second-conductivity-type well 40B.

The substrate 8 includes a first shallow trench isolation structure 34, a second shallow trench isolation structure 36, a third shallow trench isolation structure 38, and a fourth shallow trench isolation structure 31. The first shallow trench isolation structure 34 contacts a top surface of the first-conductivity-type well 50. The second shallow trench isolation structure 36 contacts the signal-side second-conductivity-type well 40A, the signal-side second-conductivity-type doped region 44, and the signal-side first-conductivity-type doped region 52. The third shallow trench isolation structure 38 contacts the electrical-ground-side second-conductivity-type well 40B, the electrical-ground-side second-conductivity-type doped region 46, and the electrical-ground-side first-conductivity-type doped region 58. The fourth shallow trench isolation structure 31 contacts a peripheral portion of the first-conductivity-type well 50. Preferably, the fourth shallow trench isolation structure 31 laterally overlies an entirety of a periphery of the first-conductivity-type well 50.

Variations of the fourth exemplary semiconductor structure in which the second conductive via 74 and/or the third conductive via 76 is removed as in the variations of the first exemplary semiconductor structure may also be employed.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a substrate and an interconnect structure located thereupon, said substrate including:
    a first p-n junction between an first-conductivity-type well and a signal-side second-conductivity-type well;
    a second p-n junction between said first-conductivity-type well and an electrical-ground-side second-conductivity-type well, wherein said signal-side second-conductivity-type well does not contact said electrical-ground-side second-conductivity-type well;
    a signal-side second-conductivity-type doped region contacting said signal-side second-conductivity-type well;
    a signal-side first-conductivity-type doped region contacting said signal-side second-conductivity-type well and not contacting said signal-side second-conductivity-type doped region;
    an electrical-ground-side second-conductivity-type doped region contacting said electrical-ground-side second-conductivity-type well; and
    an electrical-ground-side first-conductivity-type doped region contacting said electrical-ground-side second-conductivity-type well and not contacting said electrical-ground-side second-conductivity-type doped region,
    and wherein said interconnect structure includes a dielectric material layer embedding a first conductive wiring structure and a second conductive wiring structure, said first conductive wiring structure providing a first conductive electrical connection between said signal-side first-conductivity-type doped region and a signal node of an electrical circuit, and said second conductive wiring structure providing a second conductive electrical connection between said electrical-ground-side first-conductivity-type doped region and electrical ground.

2. The semiconductor structure of claim 1, wherein said substrate further includes:
    a buried insulator layer contacting a bottom surface of said first-conductivity-type well, a bottom surface of said signal-side second-conductivity-type well, and a bottom surface of said electrical-ground-side second-conductivity-type well; and
    a first shallow trench isolation structure contacting a top surface of said first-conductivity-type well.

3. The semiconductor structure of claim 2, wherein said first shallow trench isolation structure contacts said signal-side second-conductivity-type doped region and said electrical-ground-side second-conductivity-type doped region.

4. The semiconductor structure of claim 3, wherein said substrate further includes at least one deep trench isolation structure contacting said buried insulator layer and laterally surrounding said first-conductivity-type well, said signal-side second-conductivity-type well, and said electrical-ground-side second-conductivity-type well.

5. The semiconductor structure of claim 4, wherein said substrate further includes:
    a second shallow trench isolation structure contacting said signal-side second-conductivity-type well, said signal-side second-conductivity-type doped region, and said signal-side first-conductivity-type doped region; and
    a third shallow trench isolation structure contacting said electrical-ground-side second-conductivity-type well, said electrical-ground-side second-conductivity-type doped region, and said electrical-ground-side first-conductivity-type doped region.

6. The semiconductor structure of claim 1, wherein said substrate further comprises:
    a first semiconductor portion contacting a bottom surface of said signal-side second-conductivity-type well;
    a second semiconductor portion contacting a bottom surface of said electrical-ground-side second-conductivity-type well;
    a buried insulator layer contacting a bottom surface of said first-conductivity-type well, a bottom surface of said first semiconductor portion, and a bottom surface of said second semiconductor portion; and
    a first shallow trench isolation structure contacting a top surface of said first-conductivity-type well.

7. The semiconductor structure of claim 6, wherein said first shallow trench isolation structure contacts said signal-side second-conductivity-type doped region and said electrical-ground-side second-conductivity-type doped region.

8. The semiconductor structure of claim 7, wherein said substrate further includes at least one deep trench isolation structure contacting said buried insulator layer and laterally surrounding said first-conductivity-type well, said signal-side second-conductivity-type well, said electrical-ground-side second-conductivity-type well, said first semiconductor portion, and said second semiconductor portion.

9. The semiconductor structure of claim 8, wherein said substrate further includes:
    a second shallow trench isolation structure contacting said signal-side second-conductivity-type well, said signal-side second-conductivity-type doped region, and said signal-side first-conductivity-type doped region; and
    a third shallow trench isolation structure contacting said electrical-ground-side second-conductivity-type well, said electrical-ground-side second-conductivity-type doped region, and said electrical-ground-side first-conductivity-type doped region.

10. The semiconductor structure of claim 1, wherein said substrate further comprises a buried insulator layer contacting said first-conductivity-type well, said signal-side second-conductivity-type well, said electrical-ground-side second-conductivity-type well, said signal-side second-conductivity-type doped region, said signal-side first-conductivity-type doped region, said electrical-ground-side second-conductivity-type doped region, and said electrical-ground-side first-conductivity-type doped region.

11. The semiconductor structure of claim 10, wherein said signal-side second-conductivity-type well contacts all sidewall surfaces of said signal-side second-conductivity-type doped region and said electrical-ground-side second-conductivity-type well contacts all sidewall surfaces of said electrical-ground-side second-conductivity-type doped region.

12. The semiconductor structure of claim 11, further comprising a shallow trench isolation structure contacting and laterally surrounding said first-conductivity-type well, said signal-side second-conductivity-type well, and said electrical-ground-side second-conductivity-type well.

13. The semiconductor structure of claim 12, further comprising a dielectric material portion that contacts top surfaces of said first-conductivity-type well, said signal-side second-conductivity-type well, and said electrical-ground-side second-conductivity-type well.

14. The semiconductor structure of claim 1, wherein said first-conductivity-type well extends to a greater depth into said substrate from a top surface of said substrate than said signal-side second-conductivity-type well and said electrical-ground-side second-conductivity-type well, and said signal-side second-conductivity-type well and said electrical-ground-side first-conductivity-type well are embedded in said first-conductivity-type well.

15. The semiconductor structure of claim 14, wherein said substrate further includes a second-conductivity-type semiconductor layer embedding said first-conductivity-type well.

16. The semiconductor structure of claim 15, wherein said substrate further includes:
   a first shallow trench isolation structure contacting a top surface of said first-conductivity-type well;
   a second shallow trench isolation structure contacting said signal-side second-conductivity-type well, said signal-side second-conductivity-type doped region, and said signal-side first-conductivity-type doped region; and
   a third shallow trench isolation structure contacting said electrical-ground-side second-conductivity-type well, said electrical-ground-side second-conductivity-type doped region, and said electrical-ground-side first-conductivity-type doped region.

17. The semiconductor structure of claim 16, wherein said first shallow trench isolation structure contacts said signal-side second-conductivity-type doped region and said electrical-ground-side second-conductivity-type doped region.

18. The semiconductor structure of claim 1, wherein said first conductive wiring structure further provides a third conductive electrical connection between said signal-side second-conductivity-type doped region and said signal node of said electrical circuit.

19. The semiconductor structure of claim 1, wherein said second conductive wiring structure further provides a fourth conductive electrical connection between said electrical-ground-side second-conductivity-type doped region and electrical ground.

20. The semiconductor structure of claim 1, wherein said first conductive wiring structure further provides a third conductive electrical connection between said signal-side second-conductivity-type doped region and said signal node of said electrical circuit, and said second conductive wiring structure further provides a fourth conductive electrical connection between said electrical-ground-side second-conductivity-type doped region and electrical ground.

* * * * *